(12) United States Patent
Deng et al.

(10) Patent No.: US 11,778,887 B2
(45) Date of Patent: Oct. 3, 2023

(54) ARRAY SUBSTRATE AND DISPLAY DEVICE

(71) Applicant: BOE TECHNOLOGY GROUP CO., LTD., Beijing (CN)

(72) Inventors: Likai Deng, Beijing (CN); Ping Zhang, Beijing (CN); Xiaoliang Ding, Beijing (CN); Pengpeng Wang, Beijing (CN)

(73) Assignee: BOE TECHNOLOGY GROUP CO., LTD., Beijing (CN)

(\*) Notice: Subject to any disclaimer, the term of this patent is extended or adjusted under 35 U.S.C. 154(b) by 385 days.

(21) Appl. No.: 17/278,720

(22) PCT Filed: May 26, 2020

(86) PCT No.: PCT/CN2020/092254
§ 371 (c)(1),
(2) Date: Mar. 23, 2021

(87) PCT Pub. No.: WO2020/238883
PCT Pub. Date: Dec. 3, 2020

(65) Prior Publication Data
US 2022/0037429 A1 Feb. 3, 2022

(30) Foreign Application Priority Data
May 29, 2019 (CN) .......................... 201910459368.7

(51) Int. Cl.
*H10K 59/13* (2023.01)
*H10K 59/60* (2023.01)
(Continued)

(52) U.S. Cl.
CPC ........... *H10K 59/60* (2023.02); *H10K 50/865* (2023.02); *H10K 59/351* (2023.02); *H10K 59/50* (2023.02)

(58) Field of Classification Search
CPC ...... H10K 50/87; H10K 59/10; H10K 59/126; H10K 59/13
See application file for complete search history.

(56) References Cited

U.S. PATENT DOCUMENTS 8,749,537 B2 6/2014 Kim et al.
2007/0215888 A1 9/2007 Mitsuhashi
(Continued)

FOREIGN PATENT DOCUMENTS

CN 101038727 A 9/2007
CN 101510554 A 8/2009
(Continued)

OTHER PUBLICATIONS

China Patent Office, First Office Action dated Nov. 3, 2020, for corresponding Chinese application 201910459368.7.

*Primary Examiner* — Jae Lee
(74) *Attorney, Agent, or Firm* — HOUTTEMAN LAW LLC

(57) ABSTRACT

The present disclosure provides an array substrate and a display device. The array substrate includes a substrate, a pixel unit and a measurement unit on the substrate, and a compensation element. The measurement unit includes: a photosensitive device configured to detect a luminous intensity of the pixel unit; a thermosensitive device configured to measure an operating temperature of the photosensitive device; and a light source device configured to provide light to the thermosensitive device. An orthographic projection of the light source device on the substrate is within an orthographic projection of the thermosensitive device on the substrate. The compensation element is configured to compensate the luminous intensity of the pixel unit according to the luminous intensity of the pixel unit detected by the photosensitive device and the operating temperature of the
(Continued)

photosensitive device measured by the thermosensitive device.

18 Claims, 3 Drawing Sheets

(51) Int. Cl.
    *H10K 50/86*     (2023.01)
    *H10K 59/50*     (2023.01)
    *H10K 59/35*     (2023.01)

(56) References Cited

U.S. PATENT DOCUMENTS

| | | | | |
|---|---|---|---|---|
| 2007/0296886 | A1* | 12/2007 | Inada | G02F 1/133603 |
| | | | | 349/61 |
| 2012/0075278 | A1* | 3/2012 | Hara | H10K 59/353 |
| | | | | 345/76 |
| 2015/0213767 | A1* | 7/2015 | Takagi | F21V 23/0457 |
| | | | | 362/382 |
| 2017/0137605 | A1 | 5/2017 | Suzuki et al. | |
| 2018/0366523 | A1 | 12/2018 | Yoshida et al. | |
| 2019/0287453 | A1* | 9/2019 | Weng | G09G 3/3208 |
| 2020/0091253 | A1 | 3/2020 | Liu et al. | |

FOREIGN PATENT DOCUMENTS

| | | |
|---|---|---|
| CN | 101964353 A | 2/2011 |
| CN | 107785406 A | 3/2018 |
| CN | 108962136 A | 12/2018 |
| CN | 108987455 A | 12/2018 |
| CN | 109102758 A | 12/2018 |
| CN | 109697954 A | 4/2019 |
| CN | 110120411 A | 8/2019 |
| JP | 2008082938 A | 4/2008 |
| WO | WO2005/059971 A2 | 6/2005 |

* cited by examiner

ARRAY SUBSTRATE AND DISPLAY DEVICE

CROSS-REFERENCE TO RELATED APPLICATION

This is a National Phase Application filed under 35 U.S.C. 371 as a national stage of PCT/CN2020/092254, filed on May 26, 2020, an application claiming the benefit of priority to Chinese Patent Application No. 201910459368.7 filed on May 29, 2019, the contents of which are incorporated herein in their entirety by reference.

TECHNICAL FIELD

The present disclosure relates to the field of display technology, and in particular, to an array substrate and a display device.

BACKGROUND

An organic light-emitting diode (OLED) display device is a self-luminous device and does not require a backlight. Compared with a traditional liquid crystal display (LCD) device, the OLED display device provides more vivid color and a larger color gamut. In addition, the OLED display device may be made more flexible, thinner, and lighter than a typical LCD device. For a large-size OLED display device, a light-emitting device in a pixel unit of the display device will age as the service time increases, which easily causes problems such as degraded display quality and uneven display brightness.

SUMMARY

Embodiments of the present disclosure provide an array substrate, which includes a substrate, a pixel unit and a measurement unit that are disposed on the substrate, and a compensation element. The measurement unit includes: a photosensitive device configured to detect a luminous intensity of the pixel unit; a thermosensitive device configured to measure an operating temperature of the photosensitive device; and a light source device configured to provide light to the thermosensitive device. An orthographic projection of the light source device on the substrate is within an orthographic projection of the thermosensitive device on the substrate. The compensation element is configured to compensate the luminous intensity of the pixel unit according to the luminous intensity of the pixel unit detected by the photosensitive device and the operating temperature of the photosensitive device measured by the thermosensitive device.

In some embodiments, the light source device is disposed on a side of the thermosensitive device away from the substrate, a light shielding layer is disposed on a side of the light source device away from the substrate, and the orthographic projection of the light source device on the substrate is within an orthographic projection of the light shielding layer on the substrate.

In some embodiments, a light path collimation layer is disposed between the thermosensitive device and the light source device, and the light path collimation layer is configured to guide light emitted from the light source device to the thermosensitive device.

In some embodiments, the light path collimation layer includes an opening, and an orthographic projection of the opening on the substrate completely overlaps with the orthographic projection of the light source device on the substrate.

In some embodiments, the light path collimation layer includes a convex lens configured to guide light emitted from the light source device.

In some embodiments, the pixel unit includes a plurality of light-emitting devices, and one of the plurality of light-emitting devices is used as the light source device.

In some embodiments, the pixel unit includes a red light-emitting device, a green light-emitting device, a blue light-emitting device, and a white light-emitting device, and the white light-emitting device is used as the light source device.

In some embodiments, the thermosensitive device and the photosensitive device are located in a same layer and in contact with each other.

In some embodiments, the array substrate further includes a light shielding layer disposed on the substrate and on a side of the thermosensitive device close to the substrate. The light shielding layer includes an opening, an orthographic projection of the opening on the substrate completely overlaps with the orthographic projection of the thermosensitive device on the substrate, and the light source device is disposed in the opening of the light shielding layer.

In some embodiments, the light source device is on the side of the thermosensitive device close to the substrate, the photosensitive device is on a side of the thermosensitive device away from the substrate, and the orthographic projection of the light source device on the substrate, the orthographic projection of the thermosensitive device on the substrate, and an orthographic projection of the photosensitive device on the substrate completely overlap with one another.

In some embodiments, the photosensitive device and the thermosensitive device are in a same layer and in contact with each other, and the light source device is on a side of the thermosensitive device close to the substrate.

In some embodiments, the photosensitive device includes a plurality of photosensitive sub-devices, the pixel unit includes a plurality of light-emitting devices, and the plurality of photosensitive sub-devices are in one-to-one correspondence with the plurality of light-emitting devices.

In some embodiments, the orthographic projection of the light source device on the substrate completely overlaps with the orthographic projection of the thermosensitive device on the substrate.

In some embodiments, the light source device emits visible light.

In some embodiments, the light source device emits non-visible light.

In some embodiments, the light source device emits infrared light.

In some embodiments, the array substrate includes a plurality of pixel units and a plurality of measurement units, and the plurality of pixel units are in one-to-one correspondence with the plurality of measurement units.

Embodiments of the present disclosure provide a display device including the array substrate as described above.

DETAILED DESCRIPTION

To enable those of ordinary skill in the art to better understand the technical solutions of the present disclosure, the present disclosure will be further described in detail below in conjunction with the accompanying drawings and specific embodiments.

A large number of pixel units are arranged in an array substrate of a large-size OLED display device, and light-emitting devices in respective pixel units emit light according to a certain timing sequence, thereby presenting a desired picture to a user. However, as the service time increases, the light-emitting device in the pixel unit will age, which easily causes problems such as degraded display quality of the pixel unit and uneven display brightness. In order to solve the problems, a photosensitive device may be used to detect the luminous intensity of the corresponding pixel unit. When the luminous intensity of the corresponding pixel unit is weakened, a compensation unit can compensate the corresponding pixel unit, so that the display brightness of the corresponding pixel unit remains stable, and the display brightness of each pixel unit is uniform, so as to improve the display quality.

However, during the operating process of the photosensitive device, the operating temperature of the photosensitive device will change due to light irradiation and operating time, and the light-intensity detecting accuracy of the photosensitive device is affected by its operating temperature. Therefore, a thermosensitive device may be arranged adjacent to the photosensitive device to measure the operating temperature of the photosensitive device, and a light shielding layer may be arranged above the thermosensitive device to prevent light emitted by the pixel unit from affecting the thermosensitive device. By use of the relationship between the measured operating temperature of the photosensitive device and the detected luminous intensity of the pixel unit, the influence of the operating temperature of the photosensitive device on the photosensitive device can be avoided. However, the thermosensitive device is in a dark state for a long time due to the existence of the light shielding layer, and the thermosensitive device has a weak response to temperature changes or has an irregular response to temperature changes in the dark state. In order to at least partially solve the problem of the thermosensitive device's weak response to temperature changes or irregular response to temperature changes in the dark state, embodiments of the present disclosure provide an array substrate and a display device.

Figure 1:
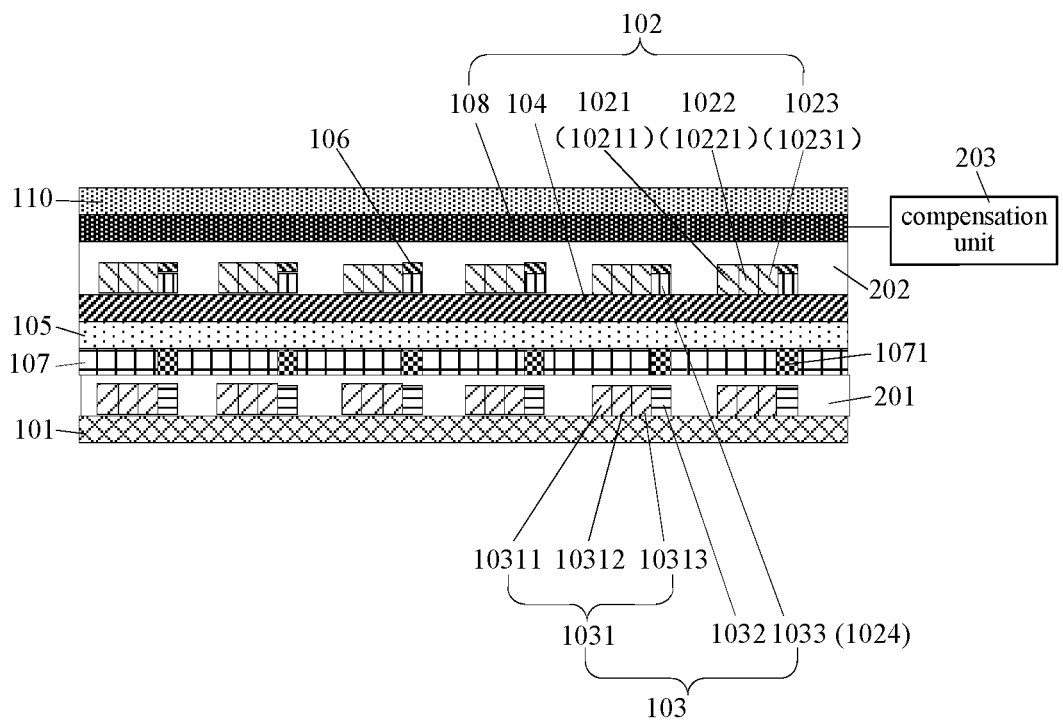
FIG. 1 is a schematic structural diagram of an array substrate according to an embodiment of the present disclosure.

FIG. 1 is a schematic structural diagram of an array substrate according to an embodiment of the present disclosure.

As shown in FIG. 1, the array substrate according to the embodiment of the present disclosure includes a substrate 101, and a plurality of pixel units 102 and a plurality of measurement units 103 on the substrate 101. Each measurement unit 103 includes a photosensitive device 1031, a thermosensitive device 1032, and a light source device 1033. In some embodiments, the plurality of pixel units 102 are in one-to-one correspondence with the plurality of measurement units 103.

In each measurement unit 103, the photosensitive device 1031 is configured to detect a luminous intensity of the pixel unit 102 corresponding to the measurement unit 103, the thermosensitive device 1032 is configured to measure an operating temperature of the photosensitive device 1031, and the light source device 1033 is configured to emit light having a preset intensity to the thermosensitive device 1032. In some embodiments, the thermosensitive device 1032 is attached to the photosensitive device 1031 to measure the operating temperature of the photosensitive device 1031 in real time. In some embodiments, the photosensitive device 1031 includes a PIN sensor.

In some embodiments, as shown in FIG. 1, the array substrate further includes a compensation unit 203 coupled to the pixel unit 102. The compensation unit 203 is configured to compensate the luminous intensity of the pixel unit 102 corresponding to the measurement unit 103 according to the luminous intensity detected by the photosensitive device 1031 and the operating temperature measured by the thermosensitive device 1032. The compensation unit 203 may be implemented by hardware such as an electronic circuit, software such as program instructions, or a combination of hardware and software.

In some embodiments, the pixel unit 102 includes a light-emitting device, and the light-emitting device includes a first electrode, a second electrode, and a light-emitting layer located between the first electrode and the second electrode.

In the embodiments of the present disclosure, the light source device 1033 can emit light having a preset intensity to provide light to the thermosensitive device 1032, so that the thermosensitive device 1032 operates in a specific lighting environment, and the thermosensitive device 1032 can respond to a temperature change accurately and clearly, thereby avoiding that the thermosensitive device 1032 has a weak or irregular response to temperature changes in the dark state. Therefore, the thermosensitive device 1032 can accurately measure the operating temperature of the photosensitive device 1031. Based on this, by use of the relationship between the measured operating temperature of the photosensitive device 1031 and the detected luminous intensity of the pixel unit 102, the photosensitive device 1031 can accurately detect the luminous intensity of the pixel unit 102, and the influence of the operating temperature on light-intensity detection of the photosensitive device 1031 is avoided.

Therefore, in the embodiments of the present disclosure, when the photosensitive device 1031 detects that the luminous intensity of the light-emitting device in the pixel unit 102 is weakened, the compensation unit can make the pixel unit 102 maintain a stable luminous intensity by adjusting a driving voltage applied to an anode of the light-emitting device of the pixel unit 102 according to the luminous intensity of the pixel unit 102 detected by the photosensitive device 1031 and the operating temperature of the photosensitive device 1031 measured by the thermosensitive device 1032. Therefore, effective compensation of the luminous intensity of the pixel unit 102 is realized, and the decrease in the luminous intensity of the pixel unit 102 caused by the increase in service time is avoided, so that the display brightness is stabilized and the display quality is improved.

In some embodiments, each pixel unit 102 may include a plurality of light-emitting devices, and each light-emitting device includes a first electrode, a light-emitting layer, and a second electrode. Each photosensitive device 1031 may include a plurality of photosensitive sub-devices, and the plurality of light-emitting devices of each pixel unit 102 are in one-to-one correspondence with the plurality of photosensitive sub-devices of the photosensitive device 1031 of the measurement unit 103 corresponding to the pixel unit 102. In this case, in each measurement unit, the thermosensitive device 1032 can simultaneously measure the operating temperatures of the plurality of photosensitive sub-devices of the photosensitive device 1031, and each photosensitive sub-device of the photosensitive device 1031 can detect the luminous intensity of the light-emitting device corresponding thereto. Therefore, effective compensation of the luminous intensity of every light-emitting device of the pixel unit 102 can be achieved.

In some embodiments, as shown in FIG. 1, each photosensitive device 1031 includes photosensitive sub-devices 10311, 10312, and 10313, and each pixel unit 102 may include light-emitting devices 1021, 1022, and 1023. The light-emitting device 1021 includes a first electrode 104, a light-emitting layer 10211 and a second electrode, the light-emitting device 1022 includes a first electrode 104, a light-emitting layer 10221 and a second electrode, and the light-emitting device 1023 includes a first electrode 104, a light-emitting layer 10231 and a second electrode. In an embodiment of the present disclosure, as shown in FIG. 1, the second electrode of each light-emitting device is disposed in an array layer 108, and the array layer 108 further includes a driving circuit for driving each light-emitting device. In some embodiments, as shown in FIG. 1, the light-emitting devices share one first electrode 104. In some embodiments, the first electrode may be a cathode of the light-emitting device and include a metal such as silver, magnesium, or an alloy thereof, and the second electrode may be an anode of the light-emitting device and include indium tin oxide, or the like, but the present disclosure is not limited thereto. In some embodiments, as shown in FIG. 1, in each light-emitting device, the first electrode is disposed on a side of the second electrode close to the substrate 101, and the light-emitting layer is located between the first electrode and the second electrode. In some embodiments, the cathode of the light-emitting device may include a metal such as silver, magnesium, or an alloy thereof, and the anode of the light-emitting device may include indium tin oxide or the like.

In some embodiments, as shown in FIG. 1, the light source device 1033 is disposed on a side of the thermosensitive device 1032 away from the substrate 101, a first light shielding layer 106 is disposed on a side of the light source device 1033 away from the substrate 101, and an orthographic projection of the light source device 1033 on the substrate 101 completely overlaps with an orthographic projection of the light shielding layer 106 on the substrate 101. In some embodiments, the orthographic projection of the light source device 1033 on the substrate 101 is within an orthographic projection of the corresponding thermosensitive device 1032 on the substrate 101. In some embodiments, the orthographic projection of the light source device 1033 on the substrate 101 completely overlaps with the orthographic projection of the corresponding thermosensitive device 1032 on the substrate 101.

In the array substrate according to the embodiments of the present disclosure, the light source device 1033 may emit light having a specific intensity to provide light to the thermosensitive device 1032, so as to cause the thermosensitive device 1032 to be in a specific lighting environment allowing sensitive measurement of the operating temperature of the photosensitive device 1031. In addition, the first light shielding layer 106 can prevent light emitted from the light source device 1033 from interfering with the pixel unit 102 to affect the display effect. In order to accurately measure the luminous intensity of the pixel unit 102 corresponding to the measurement unit 103, the photosensitive device 1031 of the measurement unit 103 may be located on a side of the pixel unit 102 close to the substrate 101, and the orthographic projection of the photosensitive device 1031 on the substrate 101 completely overlaps with an orthographic projection of the light-emitting layer of the pixel unit 102 on the substrate 101.

In some embodiments, the light source device 1033 emits visible light, but the present disclosure is not limited thereto. For example, in some embodiments, the light source device 1033 may emit invisible light such as infrared light or ultraviolet light.

In some embodiments, a thickness of the first electrode 104 may be reduced or an opening (for example, an orthographic projection of the opening on the substrate 101 completely overlaps with the orthographic projection of the light source device 1033 on the substrate 101) may be provided in the first electrode 104 to increase a ratio of light irradiated to the thermosensitive device 1032 to light emitted from the light source device 1033.

In some embodiments, as shown in FIG. 1, each pixel unit 102 of the array substrate according to the embodiment of the present disclosure includes a red light-emitting device 1021, a green light-emitting device 1022, a blue light-emitting device 1023, and a white light-emitting device 1024, and the white light-emitting device 1024 is implemented as the light source device 1033. That is, in some embodiments, the white light-emitting device 1024 in the pixel unit 102 serves as the light source device 1033 of the measurement unit corresponding to the pixel unit.

Generally, the white light-emitting device in the pixel unit is only used to provide white light having certain intensity to the red light-emitting device, the green light-emitting device, and the blue light-emitting device, so as to improve the luminous intensities of the respective light-emitting devices without affecting the light-emitting colors of the light-emitting devices, thereby improving display brightness. Different from this, in the embodiments of the present disclosure, the white light-emitting device 1024 may emit white light having a specific intensity to provide light to the thermosensitive device 1032, so that the thermosensitive device 1032 is in a specific lighting environment allowing sensitive measure of the operating temperature of the photosensitive device 1031. In this case, the first light shielding layer 106 can prevent light emitted from the white light-emitting device 1024 from interfering with light emitted from the light-emitting devices of other colors, and affecting the accuracy of the photosensitive device 1031 to measure the luminous intensities of the light-emitting devices of other colors.

By using the white light-emitting device 1024 in the pixel unit 102 as the light source device 1033, the white light-emitting device 1024 emits white light having a specific intensity to provide light to the thermosensitive device 1032, so that the array substrate according to the embodiments of the present disclosure can be manufactured relatively simply. Arrangements and materials of the electrodes of the white light-emitting device 1024 may be the same as those of the light-emitting devices of other colors, and the only difference is the arrangement and material of the light-emitting layer. Therefore, the white light-emitting device can be manufactured simultaneously with the light-emitting devices of other colors by the same process. Therefore, the manufacturing process can be simplified and the manufacturing cost can be saved.

In the embodiments of the present disclosure, as shown in FIG. 1, in each measurement unit 103 and the corresponding pixel unit 102, the thermosensitive device 1032 may be in direct contact with and arranged in a same layer as the photosensitive device 1031, and the light source device 1033 may be adjacent to and arranged in a same layer as the light-emitting devices. The term "in a same layer" means being at substantially the same level relative to the substrate. In the embodiments of the present disclosure, as shown in FIG. 1, a first protective layer 201 may cover the thermosensitive device 1032 and the photosensitive device 1031, a second protective layer 202 may cover the light source device and each light-emitting device, an insulating layer 105 may be provided between the light-emitting device and the photosensitive device 1031, and a cover layer 110 may be provided on a side of the pixel unit 102 away from the substrate 101. In some embodiments, the first protective layer 201 and the second protective layer 202 may be made of a material including resin, silicon nitride, or silicon oxide, the insulating layer 105 may be made of a material including polyimide, and the substrate 101 and the cover layer 110 may be made of a material including glass.

In some embodiments, as shown in FIG. 1, the array substrate according to an embodiment of the present disclosure may further include a light path collimation layer 107 disposed between the thermosensitive device 1032 and the light source device 1033. The light path collimation layer 107 is configured to guide light emitted from the light source device 1033 in each measurement unit 103 to the thermosensitive device 1032 in the measurement unit 103.

In some embodiments, the light path collimation layer 107 may include a plurality of collimating devices 1071 in one-to-one correspondence with the plurality of measurement units 103. In each measurement unit 103, the collimating device 1071 corresponding to the measurement unit 103 can cause the light emitted from the light source device 1033 to irradiate onto the thermosensitive device 1032, and prevent the light emitted from the light source device 1033 from affecting the photosensitive device 1031, so that the photosensitive device 1031 can accurately measure the luminous intensity of the pixel unit 102.

Figure 2:
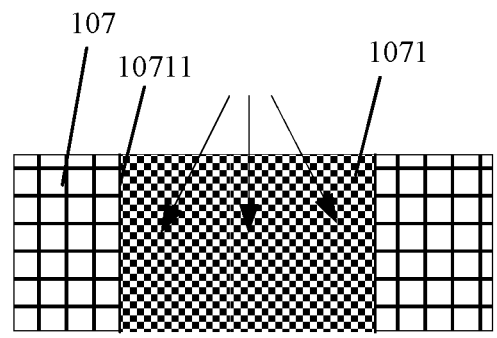
FIG. 2 is a schematic structural diagram of a collimating device according to an embodiment of the present disclosure.

FIG. 2 shows a schematic structural diagram of a collimating device of the light path collimation layer. In some embodiments, as shown in FIG. 2, the light path collimation layer 107 may include an opening 10711, the collimating device 1071 is disposed in the opening 10711, and the sidewall of the opening 10711 may be provided with a light reflecting layer or a light absorbing layer, so that light emitted from the light source device 1033 to the collimating device 1071 is emitted to the thermosensitive device 1032.

Figure 3:
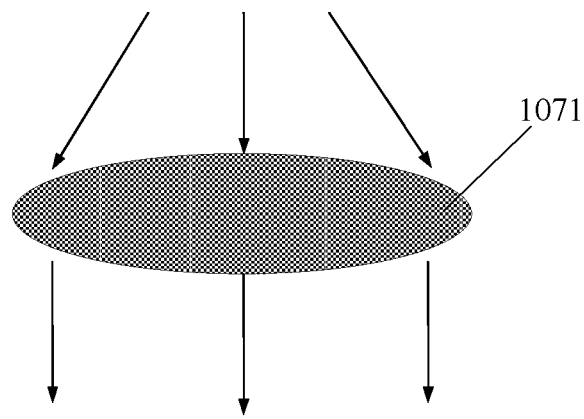
FIG. 3 is a schematic structural diagram of a collimating device according to an embodiment of the present disclosure.

FIG. 3 shows a schematic structural diagram of a collimating device of the light path collimation layer. In some embodiments, as shown in FIG. 3, the collimating device 1071 may include a lens such as a convex lens. The convex lens converts the light emitted from the light source device 1033 to the collimating device 1071 into parallel light, and the parallel light is emitted from the convex lens to the thermosensitive device 1032.

Figure 4:
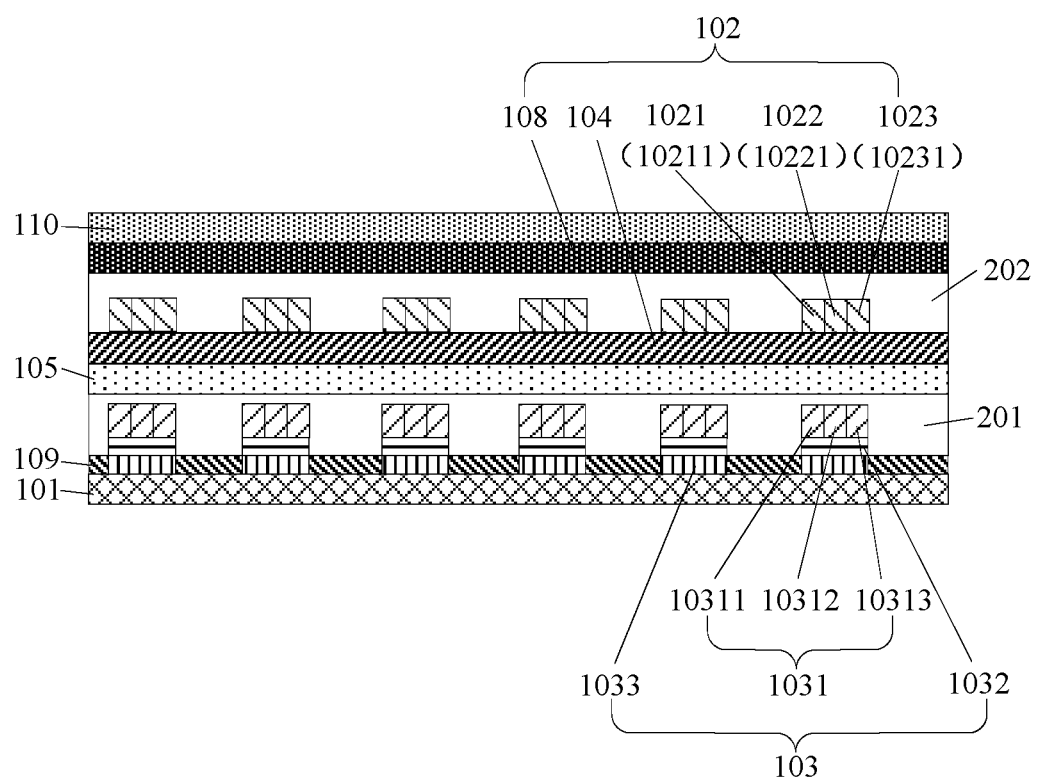
FIG. 4 is a schematic structural diagram of an array substrate according to an embodiment of the present disclosure.

FIG. 4 is a schematic structural diagram of an array substrate according to an embodiment of the present disclosure. In FIG. 4, the same reference numerals as those in FIG. 1 denote the same elements. In FIG. 4, the same contents as those of FIG. 1 will be briefly described or omitted.

Similar to FIG. 1, as shown in FIG. 4, the array substrate according to the embodiment of the present disclosure includes a substrate 101, and a plurality of pixel units 102 and a plurality of measurement units 103 on the substrate 101. Each measurement unit 103 includes a photosensitive device 1031, a thermosensitive device 1032, and a light source device 1033. The plurality of pixel units 102 and the plurality of measurement units 103 are in one-to-one correspondence.

As shown in FIG. 4, the array substrate according to the embodiment of the present disclosure further includes a second light shielding layer 109 disposed on the substrate 101 and on a side of the thermosensitive device 1032 close to the substrate 101. The second light shielding layer 109 includes a plurality of openings in one-to-one correspondence with the plurality of measurement units 103, and the light source device 1033 of each measurement unit 103 is disposed in the opening of the second light shielding layer 109 corresponding to the measurement unit 103.

In some embodiments, as shown in FIG. 4, in each measurement unit 103, the light source device 1033 is located on the side of the thermosensitive device 1032 close to the substrate, and the photosensitive device 1031 is located on a side of the thermosensitive device 1032 away from the substrate. In addition, an orthographic projection of the light source device 1033 on the substrate 101, an orthographic projection of the thermosensitive device 1032 on the substrate 101, and an orthographic projection of the photosensitive device 1031 on the substrate 101 completely overlap with one another.

In the embodiment of the present disclosure, the light source device 1033 located on the side of the thermosensitive device 1032 close to the substrate can emit light having a specific intensity to provide light to the thermosensitive device 1032. Because the light source device 1033 of each measurement unit 103 is disposed in the opening of the second light shielding layer 109 corresponding to the measurement unit 103, the light source device 1033 is located on the side of the thermosensitive device 1032 close to the substrate, and the orthographic projection of the light source device 1033 on the substrate 101 and the orthographic projection of the thermosensitive device 1032 on the substrate 101 completely overlap, light emitted from the light source device 1033 can be prevented from affecting the photosensitive device 1031 and the pixel unit 102, and the light emitted from the light source device 1033 can be accurately irradiated onto the thermosensitive device 1032.

In addition, because the photosensitive device 1031 is located on the side of the thermosensitive device 1032 away from the substrate, and the orthographic projection of the thermosensitive device 1032 on the substrate 101 completely overlaps with the orthographic projection of the photosensitive device 1031 on the substrate 101, the photosensitive device 1031 blocks the thermosensitive device 1032 while measuring the luminous intensity of the pixel unit 102, thereby avoiding the influence of the light emitted by the pixel unit 102 on the thermosensitive device 1032.

Therefore, in the array substrate according to the embodiment shown in FIG. 4, the thermosensitive device 1032 may be irradiated with light having a specific intensity to make the thermosensitive device 1032 in a specific lighting environment, and the thermosensitive device 1032 is prevented from having a weak response or an irregular response to temperature changes in a dark state. As such, the compensation unit can adjust the driving voltage applied to the anode of the light-emitting device in the pixel unit 102 according to the luminous intensity of the pixel unit 102 and the operating temperature of the photosensitive device 1031, so that the pixel unit 102 maintains a stable luminous intensity. Therefore, effective compensation of the luminous intensity of the pixel unit 102 is realized.

Figure 5:
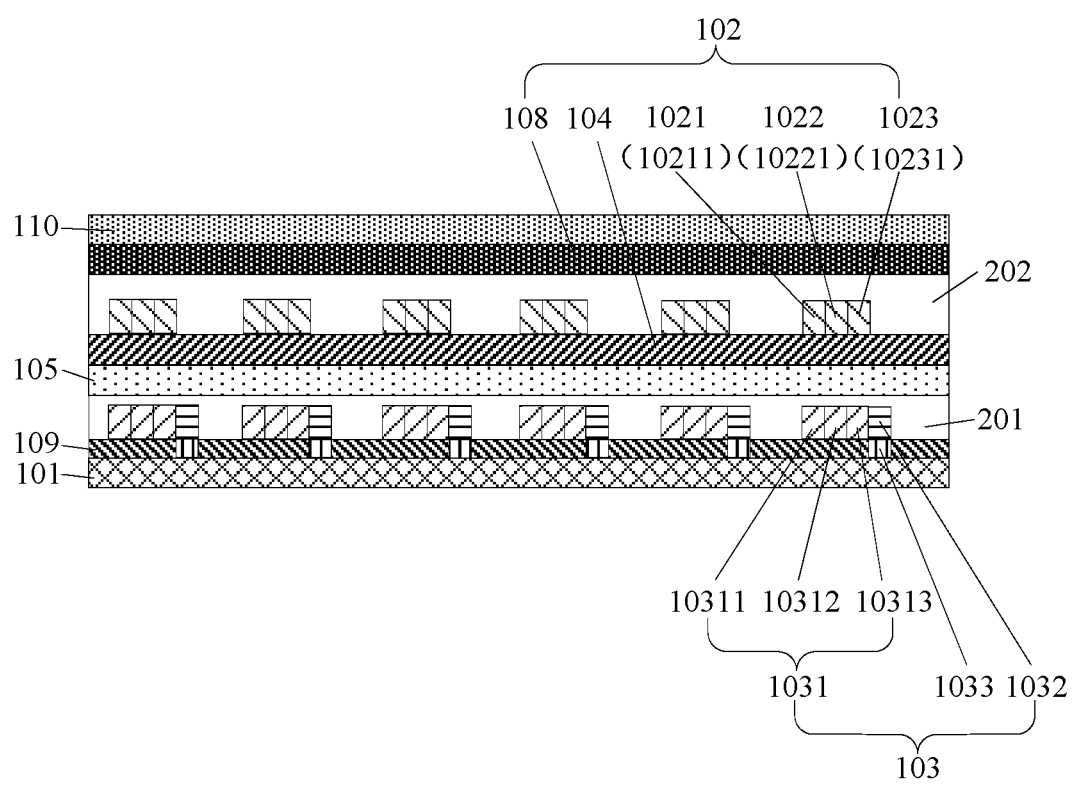
FIG. 5 is a schematic structural diagram of an array substrate according to an embodiment of the present disclosure.

FIG. 5 is a schematic structural diagram of an array substrate according to an embodiment of the present disclosure. In FIG. 5, the same reference numerals as those in FIG. 4 denote the same elements. In FIG. 5, the same contents as those of FIG. 4 will be briefly described or omitted.

Based on the same inventive concept, the array substrate shown in FIG. 5 has substantially the same structure as that of the array substrate shown in FIG. 4. The difference of the structure of the array substrate shown in FIG. 5 from the structure of the array substrate shown in FIG. 4 is that the photosensitive device 1031 and the thermosensitive device 1032 are arranged in a same layer. In addition, similar to FIG. 4, as shown in FIG. 5, in each measurement unit 103, the light source device 1033 is disposed in the opening of the second light shielding layer 109 corresponding to the measurement unit 103, the light source device 1033 is located on a side of the thermosensitive device 1032 close to the substrate 101, and an orthographic projection of the light source device 1033 on the substrate 101 and an orthographic projection of the thermosensitive device 1032 on the substrate 101 completely overlap with each other.

Embodiments of the present disclosure provide a display device including the array substrate according to the embodiments of the present disclosure. The display device according to an embodiment of the present disclosure may include a large-size OLED display device such as a smart TV, a desktop computer, a notebook computer, or the like.

It could be understood that the above implementations are merely exemplary implementations used to illustrate the principle of the present disclosure, but the present disclosure is not limited thereto. For those of ordinary skill in the art, various modifications and improvements may be made without departing from the spirit and essence of the present disclosure, and these modifications and improvements are also regarded as the protection scope of the present disclosure.

The invention claimed is:

1. An array substrate, comprising a substrate, a pixel unit and a measurement unit on the substrate, and a compensation element,
wherein the measurement unit comprises:
a photosensitive device configured to detect a luminous intensity of the pixel unit;
a thermosensitive device configured to measure an operating temperature of the photosensitive device; and
a light source device configured to provide light to the thermosensitive device, an orthographic projection of the light source device on the substrate being within an orthographic projection of the thermosensitive device on the substrate, and
wherein the compensation element is configured to compensate the luminous intensity of the pixel unit according to the luminous intensity of the pixel unit detected by the photosensitive device and the operating temperature of the photosensitive device measured by the thermosensitive device.

2. The array substrate of claim 1, wherein the light source device is on a side of the thermosensitive device away from the substrate, a light shielding layer is disposed on a side of the light source device away from the substrate, and the orthographic projection of the light source device on the substrate is within an orthographic projection of the light shielding layer on the substrate.

3. The array substrate of claim 2, wherein a light path collimation layer is disposed between the thermosensitive device and the light source device, and the light path collimation layer is configured to guide light emitted from the light source device to the thermosensitive device.

4. The array substrate of claim 3, wherein the light path collimation layer comprises an opening, and an orthographic projection of the opening on the substrate completely overlaps with the orthographic projection of the light source device on the substrate.

5. The array substrate of claim 3, wherein the light path collimation layer comprises a convex lens configured to guide the light emitted from the light source device.

6. The array substrate of claim 2, wherein the pixel unit comprises a plurality of light-emitting devices, and one of the plurality of light-emitting devices is used as the light source device.

7. The array substrate of claim 6, wherein the pixel unit comprises a red light-emitting device, a green light-emitting device, a blue light-emitting device, and a white light-emitting device, and the white light-emitting device is used as the light source device.

8. The array substrate of claim 2, wherein the thermosensitive device and the photosensitive device are located in a same layer and in contact with each other.

9. The array substrate of claim 1, further comprising a light shielding layer on the substrate and on a side of the thermosensitive device close to the substrate, wherein the light shielding layer comprises an opening, an orthographic projection of the opening on the substrate completely overlaps with the orthographic projection of the thermosensitive device on the substrate, and the light source device is in the opening of the light shielding layer.

10. The array substrate of claim 9, wherein the light source device is on the side of the thermosensitive device close to the substrate, the photosensitive device is on a side of the thermosensitive device away from the substrate, and the orthographic projection of the light source device on the substrate, the orthographic projection of the thermosensitive device on the substrate, and an orthographic projection of the photosensitive device on the substrate completely overlap with one another.

11. The array substrate of claim 9, wherein the photosensitive device and the thermosensitive device are in a same layer and in contact with each other, and the light source device is on the side of the thermosensitive device close to the substrate.

12. The array substrate of claim 1, wherein the photosensitive device comprises a plurality of photosensitive sub-devices, the pixel unit comprises a plurality of light-emitting devices, and the plurality of photosensitive sub-devices are in one-to-one correspondence with the plurality of light-emitting devices.

13. The array substrate of claim 1, wherein the light source device emits visible light.

14. The array substrate of claim 1, wherein the light source device emits non-visible light.

15. The array substrate of claim 14, wherein the light source device emits infrared light.

16. The array substrate of claim 1, wherein the array substrate comprises a plurality of pixel units and a plurality of measurement units, and the plurality of pixel units are in one-to-one correspondence with the plurality of measurement units.

17. The array substrate of claim 1, wherein the orthographic projection of the light source device on the substrate completely overlaps with the orthographic projection of the thermosensitive device on the substrate.

18. A display device, comprising the array substrate of claim 1.

* * * * *